(12) United States Patent
Vester

(10) Patent No.: US 6,791,322 B2
(45) Date of Patent: Sep. 14, 2004

(54) METHOD AND APPARATUS FOR TRANSMISSION AND RECEPTION OF AN ANALOG MAGNETIC RESONANCE SIGNAL

(75) Inventor: Markus Vester, Nuremberg (DE)

(73) Assignee: Siemens Aktiengesellschaft, München (DE)

( * ) Notice: Subject to any disclaimer, the term of this patent is extended or adjusted under 35 U.S.C. 154(b) by 22 days.

(21) Appl. No.: 10/262,328

(22) Filed: Oct. 1, 2002

(65) Prior Publication Data

US 2003/0078004 A1 Apr. 24, 2003

(30) Foreign Application Priority Data

Oct. 1, 2001 (DE) .......................................... 101 48 462

(51) Int. Cl.[7] .................................................. G01V 3/00
(52) U.S. Cl. ........................ 324/309; 324/318; 324/322
(58) Field of Search ................................. 324/300, 307, 324/309, 316, 318, 322

(56) References Cited

U.S. PATENT DOCUMENTS 5,172,059 A * 12/1992 den Boef .................... 324/307
5,245,288 A * 9/1993 Leussler ..................... 324/322
5,319,309 A * 6/1994 den Boef et al. ........... 324/309
5,384,536 A * 1/1995 Murakami et al. .......... 324/309
5,387,867 A * 2/1995 Bourg et al. ................ 324/316
5,442,292 A    8/1995 Kolem et al.
5,502,386 A * 3/1996 Bourg et al. ................ 324/316
6,294,913 B1 * 9/2001 Hinks et al. ................ 324/309
6,621,413 B1 * 9/2003 Roman et al. ......... 340/539.12

FOREIGN PATENT DOCUMENTS

DE        41 26 537      2/1993
DE        44 40 619      8/1995

* cited by examiner

Primary Examiner—Diego Gutierrez
Assistant Examiner—Dixomara Vargas
(74) Attorney, Agent, or Firm—Schiff Hardin LLP

(57) ABSTRACT

In a reception coil, a carrier signal is frequency-modulated around a carrier frequency with a modulation signal corresponding to an analog magnetic resonance signal. The frequency-modulated carrier signal is wirelessly transmitted from the reception coil to a reception circuit that is spatially separated from the reception coil. The frequency-modulated carrier signal is demodulated in the reception circuit in order to reacquire the modulation signal.

14 Claims, 1 Drawing Sheet

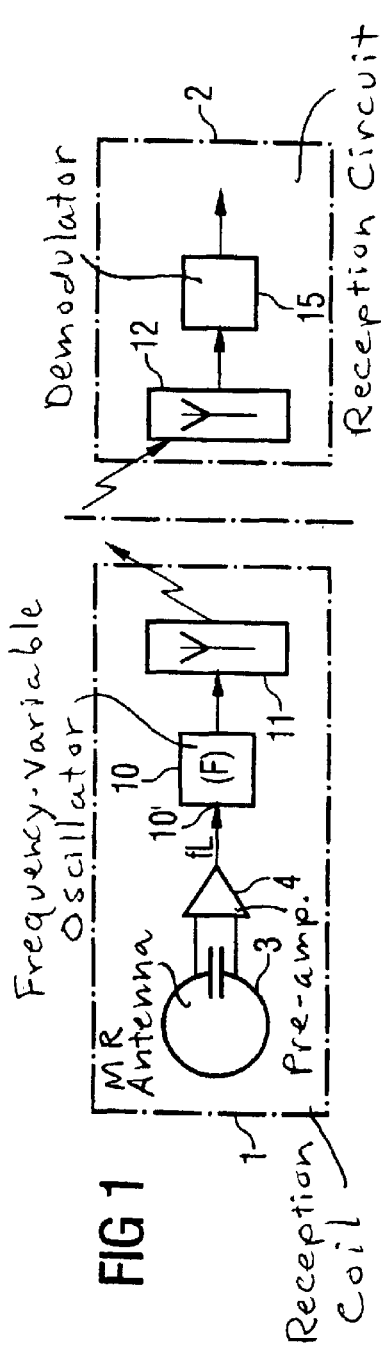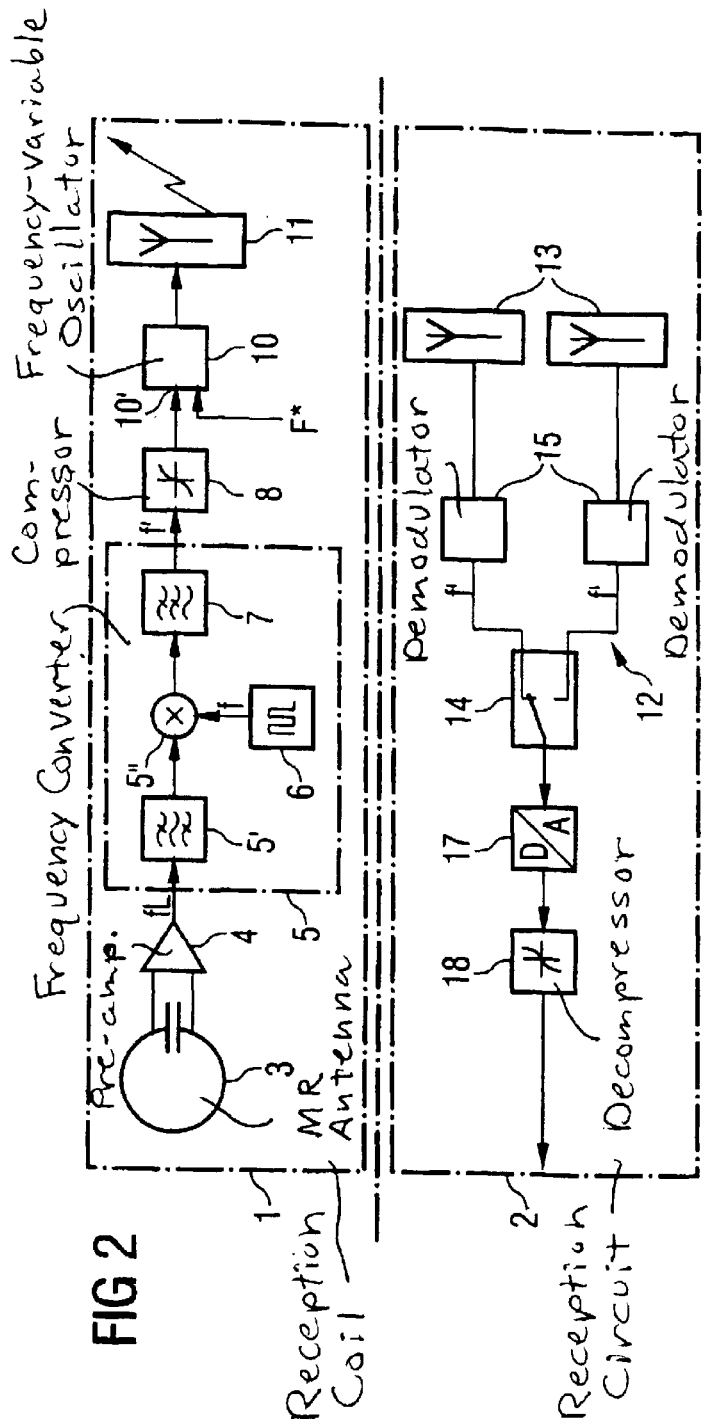

METHOD AND APPARATUS FOR TRANSMISSION AND RECEPTION OF AN ANALOG MAGNETIC RESONANCE SIGNAL

BACKGROUND OF THE INVENTION

1. Field of the Invention

The present invention is directed to a transmission method for an analog magnetic resonance signal from a reception coil to a reception circuit that is spatially separated from the reception coil. The present invention also is directed to a corresponding reception coil for the reception of an analog magnetic resonance signal and to a magnetic resonance system.

2. Description of the Prior Art

A transmission method of the above type, and a reception coil and magnetic resonance system corresponding to are known from German OS 41 26 537.

A frequency conversion (single side-band modulation) ensues in German OS 41 26 537. In such a frequency conversion, the signal-to-noise ratio of the signal converted back onto the Larmor frequency corresponds to the signal-to-noise ratio of the transmission path. The method according to German OS 41 26 537 therefore exhibits the disadvantage that considerable efforts must be undertaken in order to assure the signal-to-noise ratio required in magnetic resonance applications.

SUMMARY OF THE INVENTION

The object of the present invention is comprised in creating a transmission method and the devices corresponding therewith with which a high signal-to-noise ratio can be achieved with optimally little outlay.

This object is achieved in a transmission method wherein a carrier signal with a modulation signal corresponding to the magnetic resonance signal is frequency-modulated around a carrier frequency at the coil side, the frequency-modulated carrier signal is wirelessly transmitted from the reception coil to the reception circuit, and the frequency-modulated carrier signal is demodulated in the reception circuit in order to reacquire the modulation signal.

The above object is achieved in a reception coil having a frequency-variable oscillator with a control input and a transmission device, the control input being supplied with a modulation signal corresponding to the magnetic resonance signal, a carrier signal of the frequency-variable oscillator being frequency-modulated around a carrier frequency on the basis of the supplied modulation signal, and the frequency-modulated carrier signal being supplied to the transmission device, with which it can be wirelessly transmitted.

An inventive reception system of a magnetic resonance installation is composed of at least one such reception coil and at least one reception circuit for a carrier signal modulated in this way, the reception circuit has an antenna device for receiving the carrier signal, and the modulated carrier signal can be supplied to a demodulator with which the modulation signal can be reacquired.

When the magnetic resonance signal is converted onto an intermediate frequency in a frequency converter and the output signal of the frequency converter corresponds to the modulation signal, the frequency of the modulation signal can be reduced in a simple way. The demands of the dynamics to be made on the frequency-variable oscillator thus can be reduced.

When the intermediate frequency is considerably lower than the Larmor frequency of the magnetic resonance signal, a greater modulation index, and thus an especially high signal-to-noise ratio derives given the same frequency boost of the carrier signal. This is particularly true when the intermediate frequency lies between 1 and 3 MHz.

When the modulation signal is compressed before the frequency-modulation of the carrier signal, the signal-to-noise ratio is improved particularly given small signal amplitudes at which the noise is particularly disturbing.

When the reacquired modulation signal is digitized in the reception circuit and the digitized modulation signal is decompressed, the decompression function can be realized in an especially simple way.

When the frequency-modulated carrier signal transmitted wirelessly from the reception coil to the reception circuit is received via a number of antennas at the reception circuit side and is supplied to the reception circuit via a selection device, the antenna via which the signal is supplied to the reception circuit can be selected. A good reception of the frequency-modulated carrier signal thus is achieved when a signal fade occurs at the location of one of the antennas due to multi-path reception—which one must count on. In this case, a switch simply can be made to a different antenna.

When the carrier frequency of the unmodulated carrier signal is variable, the same components can be utilized at different carrier frequencies. A number of reception systems thus can be simultaneously operated at the same magnetic resonance installation without mutually disturbing one another.

DESCRIPTION OF THE DRAWINGS

FIGS. 1 and 2 show examples of a reception system of a magnetic resonance installation in accordance with the invention.

DESCRIPTION OF THE PREFERRED EMBODIMENTS

FIG. 1 shows the basic components of the inventive reception system.

As shown in FIG. 1, a reception system of a magnetic resonance installation has, among other things, at least one reception coil 1 and at least one reception circuit 2. The reception coil 1 and reception circuit 2 are spatially separated from one another.

In the example of FIG. 1, the reception coil 1 is fashioned as a local coil. It includes a magnetic resonance antenna 3. Using the magnetic resonance antenna 3, the reception coil 1 receives an analog magnetic resonance signal. The magnetic resonance signal has a Larmor frequency fL. The Larmor frequency fL for a typical application (basic magnetic field 1.5 T, detection of water or hydrogen) amounts, for example, to 63.6 MHz.

As also shown in FIG. 1, the magnetic resonance signal is coupled out via a pre-amplifier 4 and is supplied to a control input 10' of a frequency-variable oscillator 10. The frequency-variable oscillator can be, for example, voltage-controlled, i.e. fashioned as a VCO.

The modulation signal for the oscillator 10 is, according to FIG. 1, the magnetic resonance signal itself. By means of the modulation signal, a carrier signal of the frequency-variable oscillator 10 is frequency-modulated around a carrier frequency F. The carrier signal is supplied to a transmission device 11 from which it is wirelessly transmitted and thus is transmitted to the reception circuit 2.

In the reception circuit 2, the frequency-modulated carrier signal is received by an antenna device 12 and is supplied to a demodulator 15 with which the carrier signal is demodulated, and thus the modulation signal is re-acquired.

Given the same basic structure, FIG. 2 shows the structure of the inventive reception system in greater detail. In the embodiment according to FIG. 2, a number of advantageous developments, which are fundamentally independent of one another, are shown with which the reception system is optimized.

In FIG. 2, the magnetic resonance signal coupled out via the pre-amplifier 4 is first supplied to a frequency converter 5. According to FIG. 2, the frequency converter 5 has a band-pass 5' at the input side and a low-pass filter 7 at the output side. A mixer 5" is arranged between the two filters 5' and 7. The magnetic resonance signal is converted onto an intermediate frequency f' with the frequency converter 5.

An oscillator signal is supplied to the mixer 5" from a local oscillator 6. This signal has a local oscillator frequency f that preferably lies in the proximity of the Larmor frequency fL but differs therefrom. A frequency difference f' between the local oscillator frequency f and the Larmor frequency fL preferably lies between 1 and 3 MHz. The intermediate frequency f' is therefore considerably lower than the Larmor frequency fL.

Two frequency signals thus are present at the output of the mixer 5", namely one with the sum of Larmor frequency fL and local oscillator frequency f and one with the difference between Larmor frequency fL and local oscillator frequency f. The sum frequency is filtered out with the low-pass filter 7, so that what is now the substantially lower-frequency signal with the difference f' (intermediate frequency f') is supplied to a compressor 8.

In order to avoid additional noise arising due to the mixing, the magnetic resonance signal is filtered such in the band-pass filter 5' before being supplied to the mixer 5" so that, in particular, the mirror frequency is filtered out.

The modulation signal (which is still analog) is compressed in the compressor 8. The compression brought about by the compressor 8 is not linear. High signal amplitudes are disproportionately attenuated. The signal-to-noise ratio thus is improved, particularly for small signal amplitudes. The output signal of the compressor 8 is supplied as a control signal to the control input 10' of the frequency-variable oscillator 10. The carrier signal typically has a carrier frequency F between 1 and 2 GHz.

The frequency-modulated carrier signal then is supplied to the transmission device 11 or transmission antenna 11. The frequency-modulator carrier signal is transmitted by this, so that it is wirelessly transmitted to the reception circuit 2.

In the example of FIG. 2, the antenna device 12 has a number of individual antennas that are followed by a selection device 14. One of the signals received from the individual antennas 13 can be through-connected with the selection device 14. The antenna device 12 thus is fashioned as a diversity device.

Proceeding from the individual antennas 13, the received frequency-modulated carrier signal is supplied to demodulators 15. The demodulators 15 thus make the modulation signal available as output signals.

The modulation signal re-acquired in this way is supplied according to FIG. 2 to an analog-to-digital converter 17 via the selection device 14. The modulation signal is digitized by the analog-to-digital converter 17. The digitalized modulation signal then is supplied to a decompressor 18. The digital modulation signal is decompressed therein. The compression that previously ensued with the compressor 8 thus is canceled.

For making the magnetic resonance system more flexible and, in particular, in order to be able to operate a number of such arrangements of reception coil 1 and reception circuit 2 in parallel as warranted, the carrier frequency F is also variable. For example, it is possible to prescribe a reference frequency value F* for the frequency-variable oscillator 10 by prescribing a corresponding basic voltage value via the control input 10', the reference frequency value F* potentially varying, for example, between 1 GHz and 2 GHz in a step width of 50 MHz. Given a typical frequency boost of, for example, 8 MHz by the modulation signal, an adequately large spacing between neighboring carrier frequency F is assured in this case.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for transmitting an analog magnetic resonance signal from a reception coil to a reception circuit that is spatially separated from said reception coil, comprising the steps of:

detecting a magnetic resonance signal with a resonator in said reception coil;

generating a modulation signal dependent on said magnetic resonance signal, and compressing said modulation signal to produce a compressed modulation signal;

generating a frequency-modulated carrier signal by frequency-modulating a carrier signal around a carrier frequency with a modulation signal;

wirelessly transmitting said frequency-modulated carrier signal from said reception coil to said reception circuit; and demodulating said frequency-modulated carrier signal in said reception circuit to reacquire said compressed modulation signal, and decompressing said compressed modulation signal to recover said modulation signal.

2. A transmission method as claimed in claim 1 wherein the step of generating said modulation signal comprises converting said magnetic resonance signal to an intermediate frequency to obtain a frequency-converted signal, and using said frequency-converted signal as said modulation signal.

3. A transmission method as claimed in claim 2 wherein said magnetic resonance signal has a Larmor frequency, and comprising converting said magnetic resonance signal to a converted signal having an intermediate frequency lower than said Larmor frequency.

4. A transmission method as claimed in claim 3 comprising converting said magnetic resonance signal into a converted signal having an intermediate frequency between 1 and 3 MHz.

5. A transmission method as claimed in claim 1 wherein the step of recovering said modulation signal comprises digitizing the reacquired compressed modulation signal in said reception circuit, to obtain a digitized compressed modulation signal, and decompressing said digitized compressed modulation signal.

6. A transmission method as claimed in claim 1 comprising receiving said frequency-modulated carrier signal at said reception circuit with a plurality of antennas, and selecting a signal from at least one of said plurality of antennas for demodulation in said reception circuit.

7. A reception coil for receiving an analog magnetic resonance signal, comprising:

a resonator which receives an analog magnetic resonance signal;

a modulation circuit connected to said resonator and supplied with said analog magnetic resonance signal for producing a modulation signal dependent on said analog magnetic resonance signal;

a compressor connected to said modulation circuit and supplied with said modulation signal for compressing said modulation signal to produce a compressed modulation signal;

a frequency-variable oscillator connected to said compressor having a control input supplied with said compressed modulation signal, said frequency-variable oscillator generating a frequency-modulated carrier signal by modulating a carrier signal around a carrier frequency with said compressed modulation signal; and a transmission device connected to said frequency-variable oscillator and supplied with said frequency-modulated carrier signal therefrom for wirelessly emitting said frequency-modulated carrier signal.

8. A reception coil as claimed in claim 7 wherein said modulation circuit comprises a frequency converter connected between said resonator and said control input for converting said magnetic resonance signal into a signal having an intermediate frequency.

9. A reception coil as claimed in claim 8 wherein said magnetic resonance signal has a Larmor frequency, and wherein said frequency converter converts said magnetic resonance signal into said signal having an intermediate frequency which is lower then said Larmor frequency.

10. A reception coil as claimed in claim 9 wherein said frequency converter converts said magnetic resonance signal into a signal having said intermediate frequency in a range between 1 and 3 MHz.

11. A reception coil as claimed in claim 7 wherein said frequency-variable oscillator allows selective setting of said carrier frequency.

12. A reception system for a magnetic resonance apparatus, comprising:

a reception coil comprising a resonator which receives an analog magnetic resonance signal, a modulation circuit connected to said resonator and supplied with said analog magnetic resonance signal therefrom for generating a modulation signal dependent on said analog magnetic resonance signal, a compressor connected to said modulation circuit and supplied with said modulation signal therefrom for compressing said modulation signal to produce a compressed modulated signal, a frequency-variable oscillator having a control input connected to said compressor and supplied with said compressed modulation signal, said frequency-variable oscillator generating a frequency-modulated carrier signal by modulating a carrier signal around a carrier frequency said modulation signal, and a transmission device connected to said frequency-variable oscillator and supplied with said frequency-modulated carrier signal therefrom for wirelessly emitting said frequency-modulated carrier signal;

a reception circuit comprising an antenna arrangement in wireless communication with said transmission device for receiving said frequency-modulated carrier signal transmitted by said transmission device;

a demodulator connected to said antenna arrangement for reacquiring said compressed modulation signal from the received frequency-modulated carrier signal; and a decompressor connected to said demodulator and supplied with said compressed modulation signal therefrom for decompressing said compressed modulation signal to recover said modulation signal.

13. A reception system as claimed in claim 12 wherein said reception circuit further comprises an analog-to-digital converter following said demodulator for converting said compressed modulation signal into a digitized compressed modulation signal, and wherein said decompressor decompresses said digitized compressed modulation signal.

14. A reception system as claimed in claim 12 wherein said antenna arrangement comprises a plurality of antennas, and wherein said reception circuit includes a selection device for selecting a signal received by at least one of said antennas for demodulation.

* * * * *